(12) United States Patent
Hu et al.

(10) Patent No.: US 7,472,302 B2
(45) Date of Patent: *Dec. 30, 2008

(54) METHOD AND APPARATUS FOR REDUCING LEAKAGE POWER IN A CACHE MEMORY USING ADAPTIVE TIME-BASED DECAY

(75) Inventors: Zhigang Hu, Ridgefield, CT (US);
Stefanos Kaxiras, Patras (GR);
Margaret Martonosi, Skillman, NJ (US)

(73) Assignees: Agere Systems Inc., Allentown, PA (US); The Trustees of Princeton University, Princeton, NJ (US)

( * ) Notice: Subject to any disclaimer, the term of this patent is extended or adjusted under 35 U.S.C. 154(b) by 255 days.

This patent is subject to a terminal disclaimer.

(21) Appl. No.: 11/245,513

(22) Filed: Oct. 7, 2005

(65) Prior Publication Data

US 2006/0041769 A1 Feb. 23, 2006

Related U.S. Application Data

(63) Continuation of application No. 10/060,661, filed on Jan. 30, 2002, now abandoned, and a continuation-in-part of application No. 09/865,847, filed on May 25, 2001, now Pat. No. 6,983,388.

(60) Provisional application No. 60/243,173, filed on Oct. 25, 2000.

(51) Int. Cl.
*G06F 1/32* (2006.01)
(52) U.S. Cl. .................. 713/324; 713/320; 711/145
(58) Field of Classification Search .......... 713/320, 713/324
See application file for complete search history.

(56) References Cited

U.S. PATENT DOCUMENTS 4,420,807 A * 12/1983 Nolta et al. ............ 711/115
5,430,683 A * 7/1995 Hardin et al. .......... 365/227
5,632,038 A * 5/1997 Fuller ..................... 713/324

(Continued)

OTHER PUBLICATIONS

Stefanos Kaxiras, Zhigang Hu, Girija Narlikar, Rae McLellan, "Cache-Line Decay: A Mechanism to Reduce Cache Leakage Power", First International Workshop on Power-Aware Computer Systems (PACS), Nov. 12, 2000.*

(Continued)

*Primary Examiner*—Chun Cao
(74) *Attorney, Agent, or Firm*—Ryan, Mason & Lewis, LLP

(57) ABSTRACT

An adaptive cache decay technique is disclosed that removes power from cache lines that have not been accessed for a variable time interval, referred to as the cache line decay interval, assuming that these cache lines are unlikely to be accessed in the future. The decay interval may be increased or decreased for each cache line to increase cache performance or save power, respectively. A default decay interval is initially established for the cache and the default decay interval may then be adjusted for a given cache line based on the performance of the cache line following a cache decay. The cache decay performance is evaluated by determining if a cache line was decayed too quickly. If a cache line is decayed and the same cache contents are again required, then the cache line was decayed too quickly and the cache line decay interval is increased. If a cache line is decayed and the cache line is then accessed to obtain a different cache content, the cache line decay interval can be decreased. When a cache line is later accessed after being decayed, a cache miss is incurred and a test is performed to evaluate the cache decay performance by determining if the same cache contents are again accessed (e.g., whether the address associated with a subsequent access is the same address of the previously stored contents). The cache decay interval is then adjusted accordingly.

26 Claims, 6 Drawing Sheets

U.S. PATENT DOCUMENTS

| | | | |
|---|---|---|---|
| 5,737,746 A | | 4/1998 | Hardin et al. |
| 5,813,022 A | * | 9/1998 | Ramsey et al. .................. 711/3 |
| 5,813,028 A | * | 9/1998 | Agarwala et al. ........... 711/118 |
| 5,835,435 A | * | 11/1998 | Bogin et al. ................ 365/227 |
| 5,835,949 A | * | 11/1998 | Quattromani et al. ....... 711/135 |
| 6,041,401 A | * | 3/2000 | Ramsey et al. ................. 712/43 |
| 6,070,232 A | * | 5/2000 | Ishida et al. ................ 711/143 |
| 6,138,213 A | * | 10/2000 | McMinn ..................... 711/137 |
| 6,141,283 A | * | 10/2000 | Bogin et al. ................ 365/226 |
| 6,157,977 A | * | 12/2000 | Sherlock et al. ............. 710/310 |
| 6,345,336 B1 | * | 2/2002 | Takahashi ................... 711/125 |
| 6,385,697 B1 | * | 5/2002 | Miyazaki .................... 711/128 |
| 6,408,364 B1 | * | 6/2002 | Tan et al. .................... 711/136 |
| 6,473,814 B1 | * | 10/2002 | Lyons et al. .................. 710/35 |
| 6,490,654 B2 | * | 12/2002 | Wickeraad et al. .......... 711/133 |
| 6,510,494 B1 | * | 1/2003 | Arimilli et al. .............. 711/137 |
| 6,535,961 B2 | * | 3/2003 | Wilkerson et al. ........... 711/137 |
| 6,795,896 B1 | * | 9/2004 | Hart et al. ................... 711/118 |

OTHER PUBLICATIONS

Philips Semiconductors Datasheet, "74HC/HCT9323A Programmable ripple counter with oscillator", Oct. 27, 1995.*

Michael Powell, Se-Hyun Yang, Babak Falsafi, Kaushik Roy, T. N. Vijaykumar, "Gated-Vdd: A Circuit Technique to Reduce Leakage in Deep-Submicron Cache Memories", ACM/IEEE International Symposium on Low Power Electronics and Design (ISLPED), Aug. 2000.*

"Automatic Cache Line Access Monitoring" IBM TDB, vol. 37, No. 6A, Jun. 1994, p. 299.*

K. Stein, et al., "Storage Array and Sense/Refresh Circuit for Single Transistor Memory Cells", IEEE Journal of Solid State Circuits, vol. SC-7, No. 5, 336-340 (Oct. 1972).*

K. Stein, et al., Session V: Memory II, "Storage Array and Sense/Refresh Circuit for Single Transistor Memory Cells", IEEE International of Solid State Circuits conference, 1972, pp. 56-57.*

"Automatic Cache Line Access Monitoring" IBM TDB, vol. 37, No. 6A, p. 299 (Jun. 1994).

Burger et al., "The Declining Effectiveness of Dynamic Caching for General-Purpose Microporcessors," University of Wisconsin-Madison, CS TR #1261 (1995).

Kaxiras et al., "Cache Decay: Exploiting Generational Behavior to Reduce Cache Leakage Power," ISCA (2001).

Kaxiras et al, "Cache-Line Decay: A Mechanism to Reduce Cache Leakage Power," First International Workshop on Power-Aware Computer Systems (PACS) (Nov. 12, 2000).

Phillips Semiconductors Datasheet, "74HC/HCT9323A Programmable Ripple Counter with Oscillator," (Oct. 27, 1995).

Powell et al , "Gated-Vdd: A Circuit Technique to Reduce Leakage in Deep-Submicron Cache Memories," ACM/IEEE International Symposium on Low Power Electronics and Design (ISLPED) (Aug. 2000).

Stein et al , "Storage Array and Sense/Refresh Circuit for Single Transistor Memory Cells," IEEE Journal of Solid State Circuits, vol. SC-7, No. 5, pp. 336-340 (Oct. 1972).

Stein et al , "Session V: Memory II, Storage Array and Sense/Refresh Circuit for Single Transistor Memory Cells" IEEE International of Solid State Circuits Conference, pp. 56-57 (1972).

Wood et al , "A Model for Estimating Trace-Simple Miss Ratios," Proc of ACM Sigmetrics Conf on Measurement and Modeling of Computer Systems (May 1991).

Yang et al. An Integrated Circuit/Architecture Approach to Reducing Leakage in Deep-Submicron High-Performance I-Caches Proc of the Seventh Int'l Symposium on High-Performance Computer Architecture (HPCA) (2001).

Powell et al., "Gated-$V_{dd}$: A Circuit Technique to Reduce Leakage in Deep-Submicron Cache Memories," Purdue University, ISLPED '00, Rapallo, Italy, (2000).

Wood et al., "A Model for Estimating Trace-Sample Miss Ratios," Proc. of ACM Sigmetrics Conf. on Measurement and Modeling of Computer Systems, (May 1991).

Yang et al., "An Integrated Circuit/Architecture Approach to Reducing Leakage in Deep-Submicron High-Performance I-Caches," Proc. of the Seventh Int'l Symposium on High-Performance Computer Architecture (HPCA), (2001).

* cited by examiner

| CACHE LINE NUMBER | TAG | DATA | VALID BIT | DECAY INTERVAL 420 |
|---|---|---|---|---|
| 0 | | | | |
| 1 | | | | |
| 2 | | | | |
| ⋮ | ⋮ | ⋮ | ⋮ | ⋮ |
| C-1 | | | | |

K WORDS

WRD SIGNAL (ACCESS)

NEXT $S_0 = S_0 \cdot \overline{DI} \cdot \overline{WRD} + \overline{S_1} \cdot DI \cdot \overline{WRD}$ NEXT $S_1 = DI \cdot \overline{WRD} + S_1 \cdot \overline{S_0} \cdot \overline{WRD}$

METHOD AND APPARATUS FOR REDUCING LEAKAGE POWER IN A CACHE MEMORY USING ADAPTIVE TIME-BASED DECAY

CROSS-REFERENCE TO RELATED APPLICATIONS

This application is a continuation of U.S. patent application Ser. No. 10/060,661, filed Jan. 30, 2002 now abandoned and a continuation-in-part of U.S. patent application Ser. No. 09/865,847, filed May 25, 2001 now U.S. Pat. No. 6,983,388, which claims the benefit of U.S. Provisional Application No. 60/243,173, filed Oct. 25, 2000 each incorporated by reference herein.

FIELD OF THE INVENTION

The present invention relates generally to cache memory devices, and more particularly, to adaptive techniques for reducing the leakage power in such cache memories.

BACKGROUND OF THE INVENTION

Cache memories reduce memory access times of large external memories. FIG. 1 illustrates a conventional cache architecture where a cache memory 120 is inserted between one or more processors 110 and a main memory 130. Generally, the main memory 130 is relatively large and slow compared to the cache memory 120. The cache memory 120 contains a copy of portions of the main memory 130. When the processor 110 attempts to read an area of memory, a check is performed to determine if the memory contents are already in the cache memory 120. If the memory contents are in the cache memory 120 (a cache "hit"), the contents are delivered directly to the processor 110. If, however, the memory contents are not in the cache memory 120 (a cache "miss"), a block of main memory 130, consisting of some fixed number of words, is typically read into the cache memory 120 and thereafter delivered to the processor 110.

Cache memories 120 are often implemented using CMOS technology. To achieve lower power and higher performance in CMOS devices, however, there is an increasing trend to reduce the drive supply voltage ($V_{dd}$) of the CMOS devices. To maintain performance, a reduction in the drive supply voltage necessitates a reduction in the threshold voltage ($V_{th}$), which in turn increases leakage power dissipation exponentially. Since chip transistor counts continue to increase, and every transistor that has power applied will leak irrespective of its switching activity, leakage power is expected to become a significant factor in the total power dissipation of a chip. It has been estimated that the leakage power dissipated by a chip could equal the dynamic power of the chip within three processor generations.

One solution for reducing leakage power is to power down unused devices. M. D. Powell et al., "Gated-$V_{dd}$: A Circuit Technique to Reduce Leakage in Deep-Submicron Cache Memories," ACM/IEEE International Symposium on Low Power Electronics and Design (ISLPED) (2000) and Se-Hyun Yang et al., "An Integrated Circuit/Architecture Approach to Reducing Leakage in Deep-Submicron High-Performance I-Caches," ACM/IEEE International Symposium on High-Performance Computer Architecture (HPCA) (January 2001), propose a micro-architectural technique referred to as a dynamically resizable instruction (DRI) cache and a gated-$V_{dd}$ circuit-level technique, respectively, to reduce power leakage in static random access memory (SRAM) cells by turning off power to large blocks of the instruction cache.

U.S. patent application Ser. No. 09/865,847, filed May 25, 2001, entitled, "Method and Apparatus for Reducing Leakage Power in a Cache Memory," incorporated by reference herein, discloses a method and apparatus for reducing leakage power in cache memories by removing the power of individual cache lines that have been inactive for some period of time assuming that these cache lines are unlikely to be accessed in the future. While the disclosed cache decay techniques reduce leakage power dissipation by turning off power to the cache lines that have not been accessed within a specified decay interval, such cache decay techniques will increase the miss rate of the cache (i.e., when a cache line is accessed that has been decayed prematurely). A need therefore exists for an adaptive method and apparatus for reducing leakage power in cache memories that adjusts the decay interval based on the performance of the cache following a cache decay.

SUMMARY OF THE INVENTION

Generally, an adaptive cache decay technique is disclosed that removes power from cache lines that have not been accessed for a variable time interval, referred to as the cache line decay interval, assuming that these cache lines are unlikely to be accessed in the future. A variable cache line decay interval is established for each application or for each individual cache line. The decay interval may be increased or decreased for individual cache lines to increase cache performance or save power, respectively. In an exemplary embodiment, a default decay interval is initially established for the cache and the default decay interval may then be adjusted for a given cache line based on the performance of the cache line following a cache decay.

The cache decay performance is evaluated by determining if a cache line was decayed too quickly. For example, if a cache line is decayed and the same cache contents are again required, then the cache line was decayed too quickly and the cache line decay interval is increased. On the other hand, if a cache line is decayed and the cache line is then accessed to obtain a different cache content, the cache line decay interval can be decreased. Thus, to evaluate the cache decay performance, a mechanism is required to determine if the same cache contents are again accessed.

The decay interval is maintained using a timer that is reset each time the corresponding cache line is accessed. If the interval timer exceeds the current decay interval for a given cache line, power to the cache line is removed. Once power to the cache line is removed, the contents of the data field, and (optionally) the tag field are allowed to degrade while the valid bit associated with the cache line is reset. When a cache line is later accessed after being powered down by the present invention, a cache miss is incurred (because the valid bit has been reset) while the cache line is again powered up and the data is obtained from the next level of the memory hierarchy. In addition, a test is performed to evaluate the cache decay performance by determining if the same cache contents are again accessed (e.g., whether the address associated with a subsequent access is the same address of the previously stored contents). The cache decay interval is then adjusted accordingly.

The cache decay techniques of the present invention can be successfully applied to both data and instruction caches, to set-associative caches and to multilevel cache hierarchies.

A more complete understanding of the present invention, as well as further features and advantages of the present invention, will be obtained by reference to the following detailed description and drawings.

DETAILED DESCRIPTION

Figure 1:
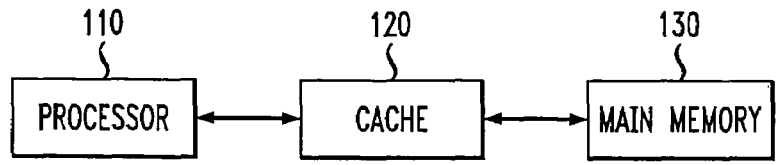
FIG. 1 illustrates a conventional cache architecture.
Figure 2:
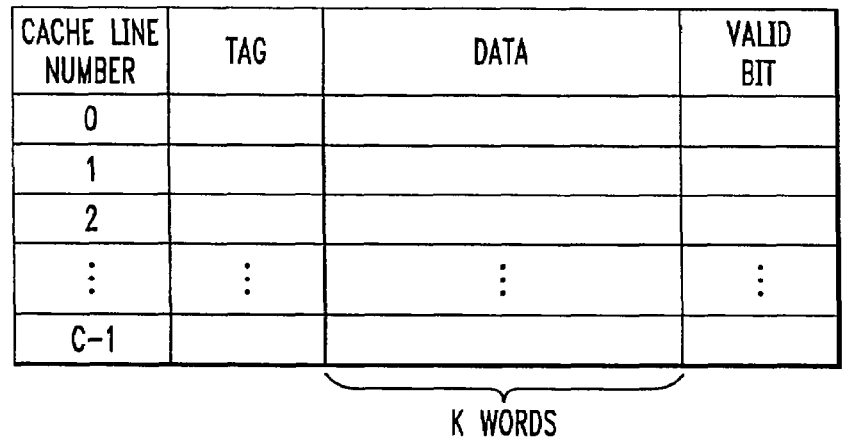
FIG. 2 illustrates the structure of the conventional cache memory of FIG. 1 in further detail.

FIG. 2 illustrates the structure of the conventional cache memory 120 of FIG. 1 in further detail. As shown in FIG. 2, the cache memory 120 consists of C cache lines of K words each. The number of lines in the cache memory 120 is generally considerably less than the number of blocks in main memory 130. At any time, a portion of the blocks of main memory 130 resides in lines of the cache memory 120. An individual line in the cache memory 120 cannot be uniquely dedicated to a particular block of the main memory 130. Thus, as shown in FIG. 2, each cache line includes a tag indicating which particular block of main memory 130 is currently stored in the cache 120. In addition, each cache line includes a valid bit indicating whether the stored data is valid.

The present invention provides adaptive cache decay technique that remove power from cache lines that have not been accessed for a variable time interval, referred to as the cache line decay interval. Thus, the present invention allows a variable cache line decay interval to be uniquely established for each application, or even for each individual cache line associated with an application. The decay interval may adjusted for each cache line to increase performance or save power, as desired. In one exemplary embodiment, a default decay interval is initially established for the cache and the default decay interval may then be adjusted for a given cache line based on the performance of the cache line following a cache decay.

Generally, after a cache line is decayed in accordance with the present invention, the cache line performance is evaluated by determining if the cache line was decayed too quickly. For example, if a cache line is decayed and the same cache contents are required (i.e., the contents of the same block of main memory 130), the cache line was decayed too quickly and the cache line decay interval is increased. Similarly, if a cache line is decayed and the cache line is then accessed for different cache contents, the cache line decay interval is decreased. Thus, to evaluate the cache decay performance, a mechanism is required to determine if the same cache contents are again accessed. In one embodiment, the power is maintained on the tag portion of a cache line following a decay, so that the address associated with a subsequent access can be compared to the address of the previously stored contents. When power is always maintained on the tags, there is a significant amount of power is consumed (approximately 10% of the cache leakage for a 32 KB cache). Thus, in a further variation, the present invention assumes that the same cache contents are required if a subsequent access occurs within a specified time interval. In other words, the present invention infers possible mistakes according to how fast a cache miss occurs after a cache decay.

Time-Based Cache Decay

The cache decay techniques described in U.S. patent application Ser. No. 09/865,847, filed May 25, 2001, entitled, "Method and Apparatus for Reducing Leakage Power in a Cache Memory," reduce leakage power dissipation in caches. The power to a cache line that has not been accessed within a decay interval is turned off. When a cache line is thereafter accessed that has been powered down, a cache miss is incurred while the line is powered up and the data is fetched from the next level of the memory hierarchy. The recency of a cache line access is represented via a digital counter that is cleared on each access to the cache line and incremented periodically at fixed time intervals. Once the counter reaches a specified count, the counter saturates and removes the power (or ground) to the corresponding cache line.

It has been observed that decay intervals tend to be on the order of tens or hundreds of thousands of cycles. The number of cycles needed for a reasonable decay interval thus makes it impractical for the counters to count cycles (too many counter bits would be required). Thus, the number of required bits can be reduced by "ticking" the counters at a much coarser level, for example, every few thousand cycles. A global cycle counter can be utilized to provide the ticks for smaller cache-line counters. Simulations have shown that a two-bit counter for a given cache line provides sufficient resolution with four quantized counter levels. For example, if a cache line should be powered down 10,000 clock cycles following the most recent access, each of the four quantized counter levels corresponds to 2,500 cycles.

Figure 3:
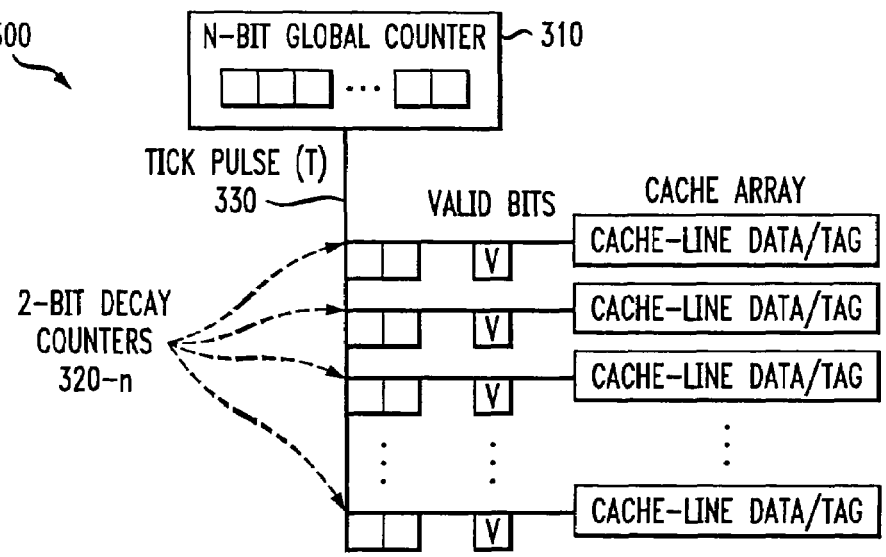
FIG. 3 illustrates a cache memory in accordance with the cache decay techniques of U.S. patent application Ser. No. 09/865,847, filed May 25, 2001, entitled, "Method and Apparatus for Reducing Leakage Power in a Cache Memory;"

FIG. 3 illustrates a digital implementation of a cache memory 300 in accordance with U.S. patent application Ser. No. 09/865,847. As shown in FIG. 3, the cache memory 300 includes a two-bit saturating counter 320-n (hereinafter, collectively referred to as counters 320) associated with each cache line, and an N-bit global counter 310. In addition, each cache line includes a tag indicating which particular block of main memory 130 is currently stored in the cache line and a valid bit indicating whether the stored data is valid. To save power, the global counter 310 can be implemented, e.g., as a binary ripple counter. An additional latch (not shown) holds a maximum count value that is compared to the global counter 310. When the global counter 310 reaches the maximum value, the global counter 310 is reset and a one-clock-cycle T signal is generated on a global time signal distribution line 330. The maximum count latch (not shown) is non-switching and does not contribute to dynamic power dissipation. In general and on average using small cache line counters, very few bits are expected to switch per cycle.

To minimize state transitions in the counters 320 and thus minimize dynamic power consumption, the exemplary digital implementation of the present invention uses Gray coding so that only one bit changes state at any time. Furthermore, to simplify the counters 320 and minimize the transistor count, the counters 320 are implemented asynchronously. In a further variation, the counters 310, 320 can be implemented as shift registers.

For a more detailed discussion of the implementation details of the cache memory 300, see U.S. patent application Ser. No. 09/865,847, filed May 25, 2001, entitled, "Method and Apparatus for Reducing Leakage Power in a Cache Memory," incorporated by reference herein.

Adaptive Time-Based Cache Decay

Figures 4, 8:
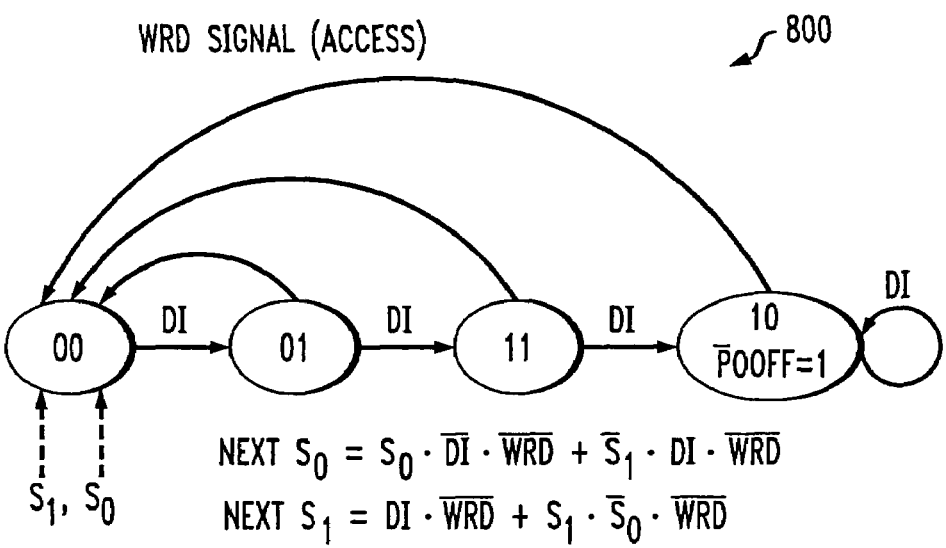
FIG. 4 illustrates the structure of a cache memory in accordance with the present invention.
FIG. 8 provides a state diagram for the exemplary two-bit counter of FIG. 5.

FIG. 4 illustrates the structure of a cache memory 400 in accordance with the present invention. As shown in FIG. 4, the cache memory 400 consists of C cache lines of K words each. Each cache line includes a tag identifying the particular block of main memory 130 that is currently stored in the cache 400 and a valid bit indicating whether the stored data is valid. In addition, in accordance with the present invention, each cache line has an associated field that records the current decay interval for the cache line. As previously indicated, the decay interval can be varied by the present invention based on cache performance following a cache decay. There are three exemplary methods discussed herein to vary the decay interval on a cache-line by cache-line basis.

Figure 5:
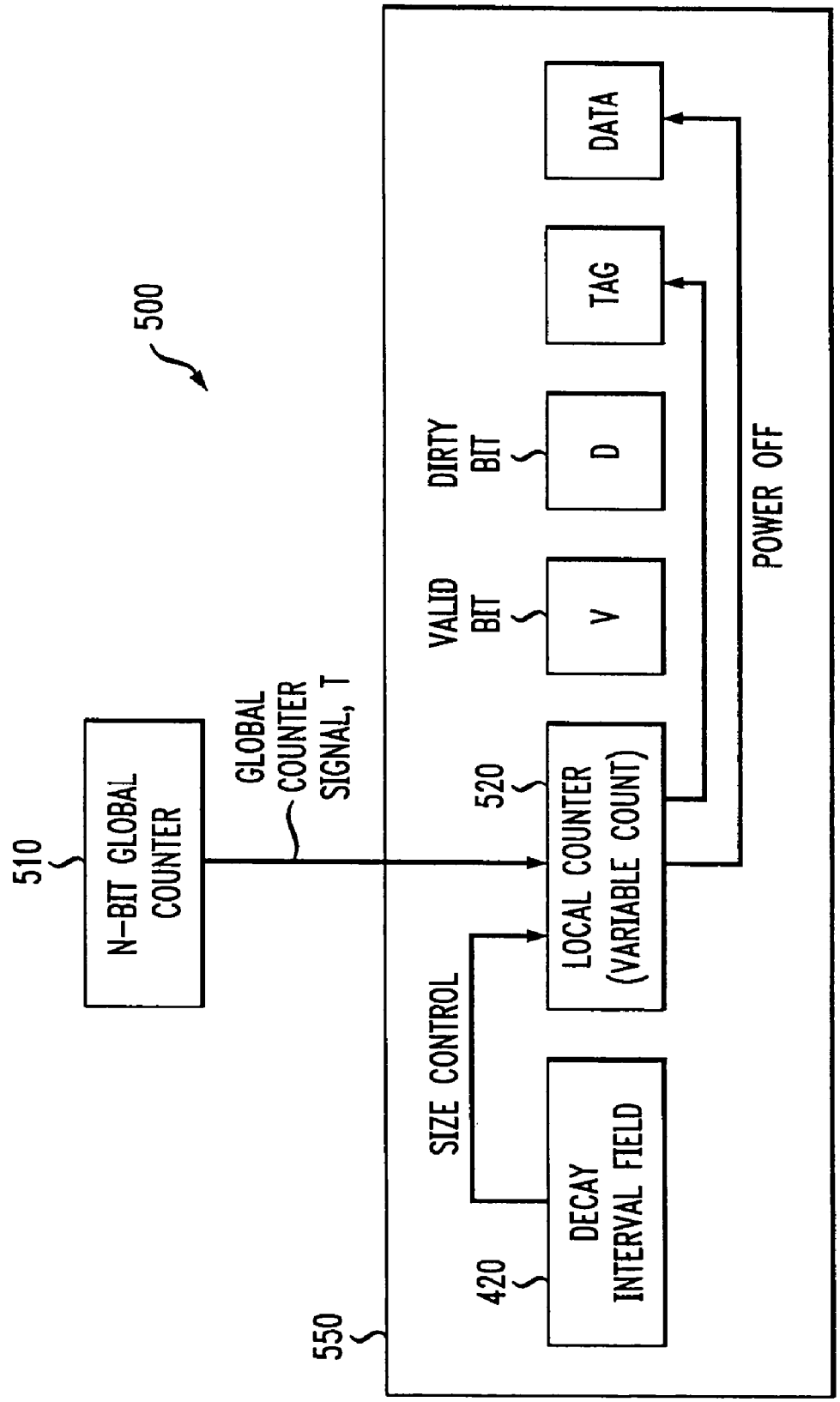
FIGS. 5 through 7 illustrate various digital implementations of cache memories in accordance with the present invention.

In the first method, shown in FIG. 5, the current decay interval field 420 in the cache memory 400 controls the size of a local counter 520 associated with an individual cache line 550. In this case, a small decay interval only utilizes few of the bits of the local counter 520 to count the passage of time. A large decay interval utilizes more bits of the local cache line counter 520. In this embodiment, there is only one global counter 510 providing the timing signal, T. This first method requires local counters 520 of variable size and of a small number of bits that can be controlled by the decay interval field 420. The decay interval for a given cache line 550 is the result of multiplying the fixed global time period, T, by the maximum count of the local counter 520 which is set independently for a given cache line 550.

In addition, each cache line 550 includes the data, a tag indicating which particular block of main memory 130 is currently stored in the cache line 550, a valid bit (V) indicating whether the stored data is valid and a dirty bit (D) indicating whether the value stored in the cache line 550 needs to be written back to the appropriate location of main memory 130, as identified by the tag. The dirty bit is set by the processor each time the cache is updated with a new value without updating the corresponding location(s) of main memory.

To save power, the global counter 510 can be implemented, for example, as a binary ripple counter. An additional latch (not shown) holds a maximum count value that is compared to the global counter 510. When the global counter 510 reaches the maximum value, the global counter 510 is reset and a one-clock-cycle T signal is generated on a global time signal distribution line, T. The maximum count latch (not shown) is non-switching and does not contribute to dynamic power dissipation. Generally, very few bits are expected to switch per cycle, on average, using small cache line counters. The cache memory 500 shown in FIG. 5 can be part of a digital signal processor (DSP), microcontroller, microprocessor, application specific integrated circuit (ASIC) or another integrated circuit.

Figure 6:
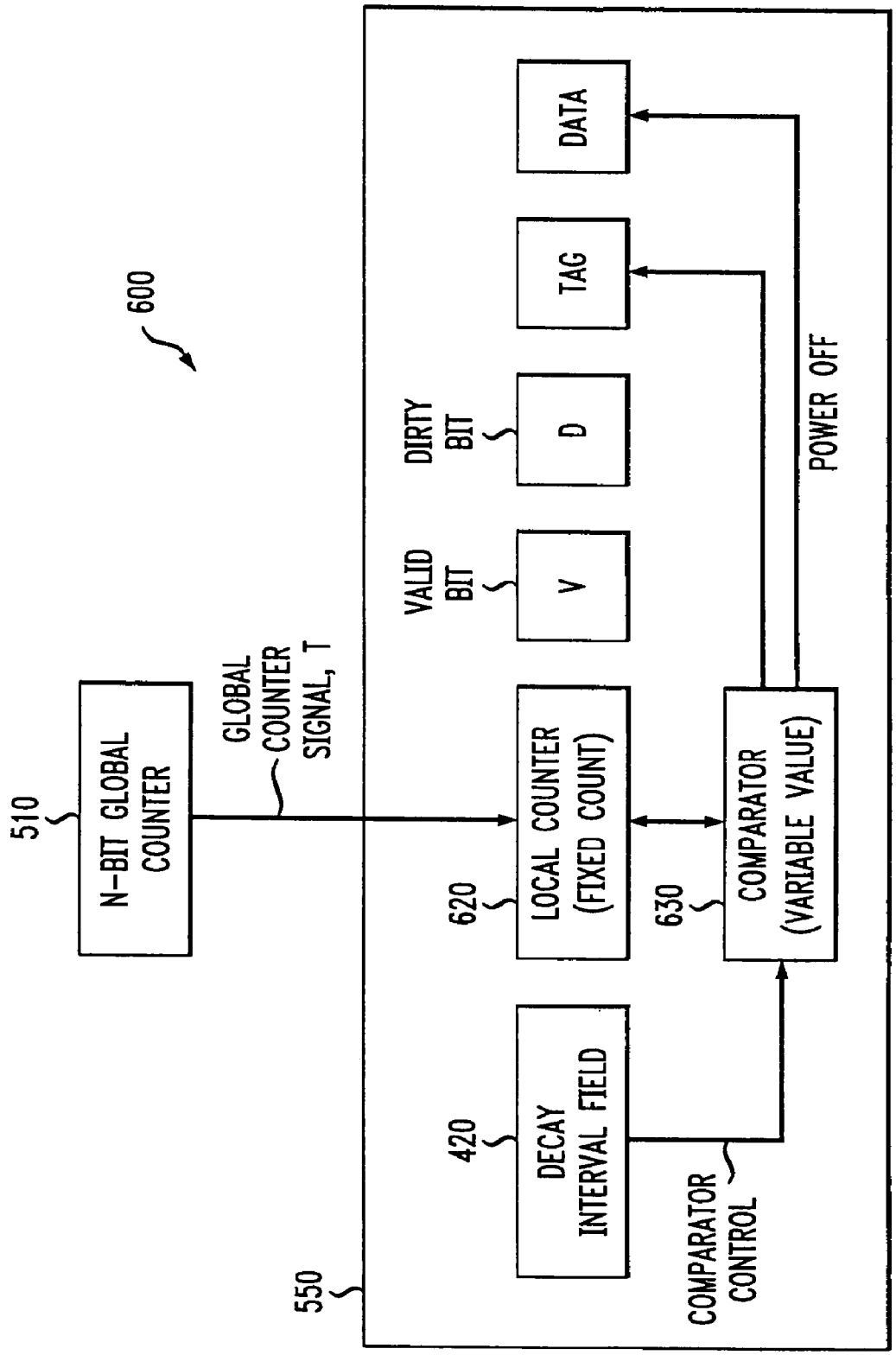

The second method, shown in FIG. 6, is similar to the method discussed above in conjunction with FIG. 5, but instead of using a variable sized local counter 520, a fixed sized local counter 620 of sufficient number of bits (possibly more than two) is used. A comparator 630 is then used to implement the variable maximum value that the counter is allowed to reach. The comparator 630 is set by the decay interval field 420 to a predetermined value. The local counter 620 is allowed to count up to this predetermined value. When the local counter 6260 reaches the value set in the comparator it is considered the end of the count as in the previous cases.

Figure 7:
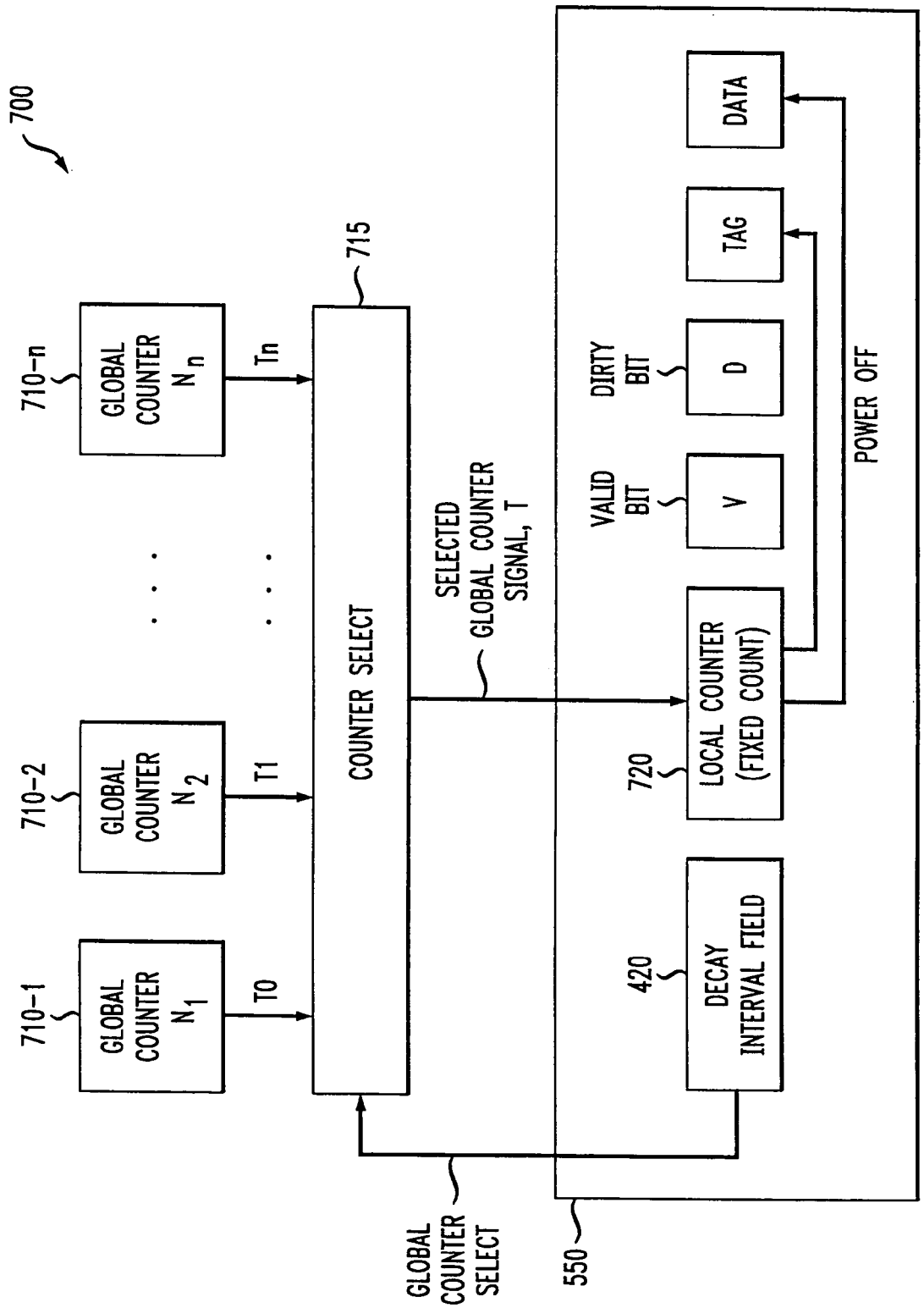

In the third method, shown in FIG. 7, a number of different global counters $N_0$ through $N_n$ (hereinafter, collectively referred to as global counters N), representing different decay intervals, are provided. The decay interval field 420 for a given cache line 550 generates a signal that is applied to a global counter selector 715 to thereby select the global counter $N_i$ from which it will receive the timing signal to feed to the local (fixed-sized) cache-line counter 720. In this case, the decay interval 420 for a given cache line 550 is the result of multiplying the selected global time period $N_i$ by the maximum count of the local counter 720 which is fixed for all cache lines. A small decay interval field selects the timing signal of a small global counter and a large decay interval field selects the timing signal of a large global counter. The magnitudes of the global counters are determined independently (either statically or dynamically at run-time) to suit the application or the operational environment of the computer system (low power or high performance).

In an implementation where a possible mistake is inferred based on how fast a cache miss occurs after a cache decay, the local counter 520, 620, 720 of a cache line 550 is reset upon decay and then reused to gauge dead time (i.e., the amount of time until a subsequent access). If dead time turns out to be short (e.g., the local counter did not advance a single step), then a mistake is inferred, causing a decay-miss. However, if the local counter reaches its maximum value while still in the dead period, then a successful decay is inferred. A mistake-miss with the counter at minimum value (00 or 11 in a two bit counter implementation), causes the decay interval to be adjusted upwards. A successful decay with counter at maximum value (10) causes the decay interval to be adjusted downwards. Misses with the counter at intermediate values (01 or 11) do not affect the decay interval. This implementation can be extended to the variable size counters 620, 630 mentioned above in conjunction with FIG. 6. In a variable sized counter, only events in the first value and the last value can affect the decay interval whereas events in the intermediate values have no effect.

Under different assumptions about power consumption or to improve performance or power, the range of values where the decay interval field can be increased or decreased can be modified. Three ranges of values of the effective local counter (if it is of variable size or variable maximum count) are defined, namely, (i) the range of values where the decay interval increases, (ii) the range of values where the decay interval remains unaffected and (iii) the range of values where the decay interval is decreased. These ranges are selected to suit the computing environment and can be changed dynamically depending on the requirements of the computing system (performance or power conservation).

FIG. 8 provides a state diagram 800 for exemplary two-bit (S0, S1), saturating, Gray-code counters 520 with two inputs (WRD and decay interval (DI)). Generally, each cache line contains circuitry to implement the state machine depicted in FIG. 8. T is the global time signal generated by the (synchronous) global counter 510 to indicate the passage of time. DI is the current decay interval setting for the cache line. The second state machine input is the cache line access signal, WRD, which is decoded from the address and is the same signal used to select a particular row within the cache memory 500 (e.g., the WORD-LINE signal). As shown in FIG. 8, state transitions occur asynchronously on changes of the two input signals, DI and WRD. Since DI and WRD are well-behaved signals, there are no meta-stability problems. The only output is the cache-line switch state, PowerOFF (POOFF). The cache line is reset and returns to state 00 each time the cache line is accessed.

When power to a cache line is turned off (state 10), the cache decay should disconnect the data and (optionally) corresponding tag fields associated with the cache line from the power supply. Removing power from a cache line has important implications for the rest of the cache circuitry. In particular, the first access to a powered-off cache line should:

1. result in a cache miss (since data and tag might be corrupted without power);
2. reset the corresponding counter 520-i and restore power to the cache line (i.e., restart the decay mechanism); and
3. be delayed for a period of time until the cache-line circuits stabilize after power is restored (the inherent access time to main memory should be a sufficient delay in many situations).

To satisfy these requirements, the present invention employs the Valid bit of the cache line as part of the decay mechanism, as discussed above in conjunction with FIGS. 5-7, shown in FIG. 7. The cache-line power control in accordance with the present invention ensures that the valid bit is always powered (as is the counter). Second, a reset capability is provided to the valid bit so it can be reset to 0 (invalid) by the decay mechanism. The PowerOFF signal clears the valid bit. Thus, the first access to a powered-off cache line always results in a miss regardless of the contents of the tag. Since satisfying this miss from the lower memory hierarchy is the only way to restore the valid bit, a newly powered cache line will have enough time to stabilize. In addition, no other access (to this cache line) can read the possibly corrupted data in the interim.

Figure 9:
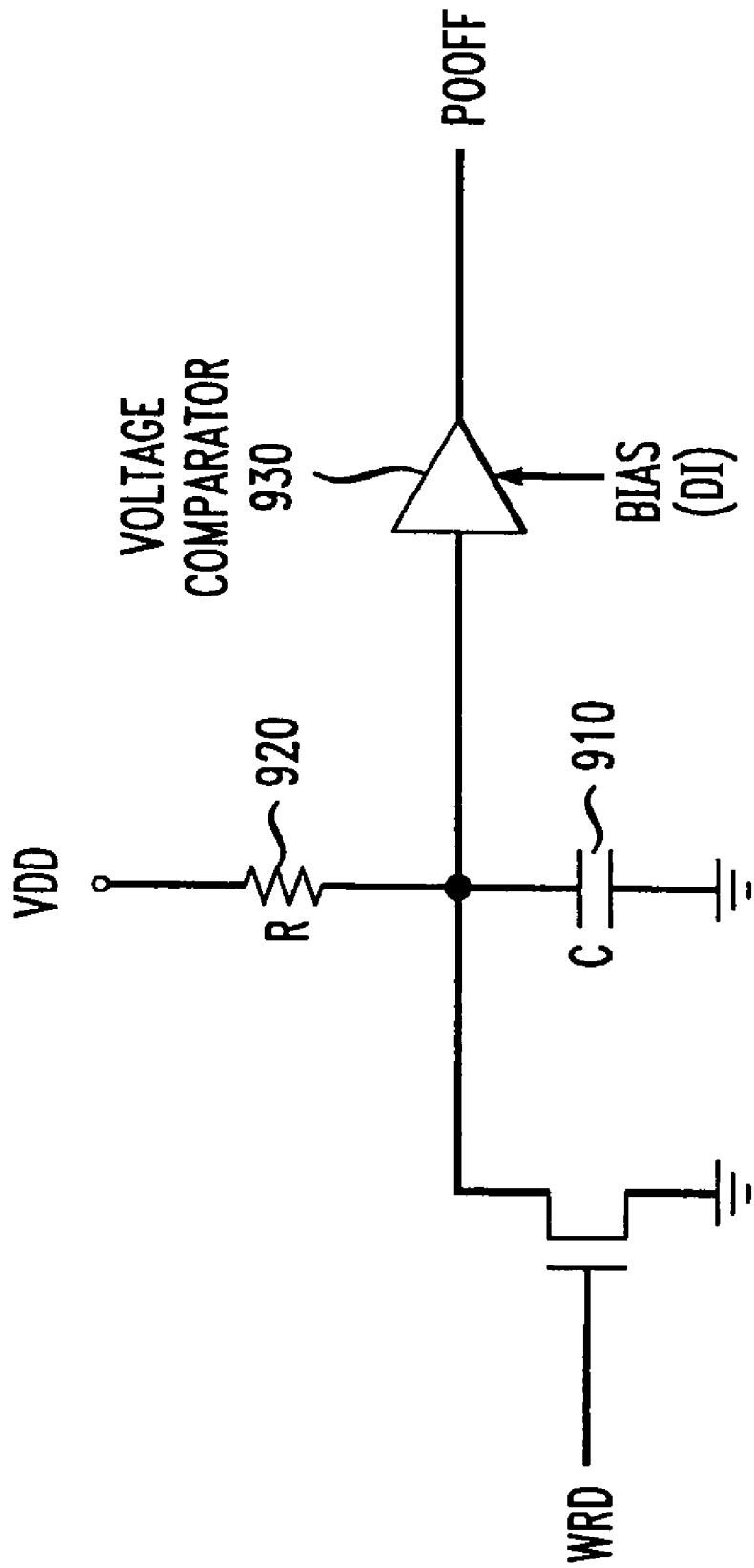
FIG. 9 illustrates an analog implementation of a decay counter for a cache memory in accordance with the present invention.

The recency of a cache line access can alternatively be implemented using an event, such as the charging or discharging of a capacitor 910, as shown in FIG. 9. Thus, each time a cache line is accessed, the capacitor is grounded. In the common case of a frequently accessed cache-line, the capacitor will be discharged. Over time, the capacitor is charged through a resistor 920 connected to $V_{dd}$. The bias of a voltage comparator 930 is adjusted in accordance with the present invention using the decay interval (DI). Once the charge reaches a value corresponding to the decay interval, the voltage comparator 930 detects the charge, asserts the PowerOFF signal and disconnects the power supply from the corresponding cache line.

It is to be understood that the embodiments and variations shown and described herein are merely illustrative of the principles of this invention and that various modifications may be implemented by those skilled in the art without departing from the scope and spirit of the invention.

We claim:

1. A cache memory, comprising:
a plurality of cache lines for storing a value from main memory, at least one of said cache lines having an associated cache line decay interval; and
a timer associated with at least one of said plurality of cache lines, at least one of said timers configured to control a signal that removes power to said associated cache line after said cache line decay interval, wherein said cache line decay interval is adjusted based on an evaluation of a performance of said cache memory.

2. The cache memory of claim 1, wherein a timer associated with a given cache line is reset each time said associated cache line is accessed.

3. The cache memory of claim 1, wherein said cache line decay interval is increased following a cache miss for said associated cache line.

4. The cache memory of claim 1, wherein said cache line decay interval is decreased following a successful cache decay.

5. The cache memory of claim 1, wherein said decay interval adjustment is implemented by adjusting a reference value in a comparator.

6. The cache memory of claim 1 wherein said decay interval adjustment is implemented by varying the number of active bits in a local counter.

7. The cache memory of claim 1 wherein said decay interval adjustment is implemented with a plurality of global counters of different magnitude and a selection of the global timing signal for a given cache line that arrives at a local counter of a given cache line.

8. The cache memory of claim 1, wherein said timer is a k bit timer and said timer receives a tick from a global N-bit counter where k is less than N.

9. The cache memory of claim 1, wherein said timer receives a tick from a selected one of a plurality of global counters.

10. The cache memory of claim 1, further comprising a dirty bit associated with at least one of said cache lines to indicate when a contents of said cache line must be written back to main memory before said power is removed from said associated cache line after said decay interval.

11. The cache memory of claim 1, wherein said removing power from said associated cache line resets a valid field associated with said cache line.

12. The cache memory of claim 1, wherein said timer is an analog device that detects a predefined voltage on said device corresponding to said decay interval.

13. A method for reducing leakage power in a cache memory, said cache memory having a plurality of cache lines, said method comprising the steps of:
resetting a timer each time a corresponding cache line is accessed;
removing power from said associated cache line after said timer reaches a cache line decay interval; and
adjusting said cache line decay interval for at least one of said cache lines based on an evaluation of a performance of said cache memory.

14. The method of claim 13, wherein said cache line decay interval is increased following a cache miss for said associated cache line.

15. The method of claim 13, wherein said cache line decay interval is decreased following a successful cache decay.

16. The method of claim 13, wherein said step of adjusting said cache line decay interval is implemented by adjusting a reference value in a comparator.

17. The method of claim 13, wherein said step of adjusting said cache line decay interval is implemented by varying the number of active bits in a local counter.

18. The method of claim 13, wherein said step of adjusting said cache line decay interval is implemented with a plurality of global counters of different magnitude and a selection of the global timing signal for a given cache line that arrives at a local counter of a given cache line.

19. The method of claim 13, wherein said timer is a k bit timer and said timer receives a tick from a global N-bit counter where k is less than N.

20. The method of claim 13, wherein said timer receives a tick from a selected one of a plurality of global counters.

21. The method of claim 13, further comprising a dirty bit associated with at least one of said cache lines to indicate when a contents of said cache line must be written back to main memory before said power is removed from said associated cache line after said decay interval.

22. The method of claim 13, wherein said removing power from said associated cache line resets a valid field associated with said cache line.

23. The method of claim 13, wherein said timer is an analog device that detects a predefined voltage on said device corresponding to said cache line decay interval.

24. An integrated circuit, comprising:
   a cache memory having a plurality of cache lines for storing a value from main memory, at least one of said cache lines having an associated cache line decay interval; and
   a timer associated with at least one of said plurality of cache lines, at least one of said timers configured to control a signal that removes power to said associated cache line after said cache line decay interval, wherein said cache line decay interval is adjusted based on an evaluation of a performance of said cache memory.

25. The integrated circuit of claim 24, wherein said cache line decay interval is increased following a cache miss for said associated cache line.

26. The integrated circuit of claim 24, wherein said cache line decay interval is decreased following a successful cache decay.

* * * * *

UNITED STATES PATENT AND TRADEMARK OFFICE
CERTIFICATE OF CORRECTION

| | | |
|---|---|---|
| PATENT NO. | : 7,472,302 B2 | Page 1 of 1 |
| APPLICATION NO. | : 11/245513 | |
| DATED | : December 30, 2008 | |
| INVENTOR(S) | : Zhigang Hu | |

It is certified that error appears in the above-identified patent and that said Letters Patent is hereby corrected as shown below:

Title Page: Item 75 "Zhigang Hu, Ridgefield, CT (US); Stefanos Kaxiras, Patras (GR);" should be replaced by --Zhigang Hu, Princeton, NJ (US); Stefanos Kaxiras, Jersey City, NJ (US);--.

Signed and Sealed this
Fourth Day of December, 2012

David J. Kappos
*Director of the United States Patent and Trademark Office*